United States Patent [19]

Brice

[11] Patent Number: 4,488,246
[45] Date of Patent: Dec. 11, 1984

[54] INTEGRATED LOGIC NETWORK WITH SIMPLIFIED PROGRAMMING

[75] Inventor: Jean M. Brice, Grenoble, France

[73] Assignee: Societe pour l'Etude et la Fabrication des Circuits Integres Speciaux, Grenoble, France

[21] Appl. No.: 315,508

[22] Filed: Oct. 27, 1981

[30] Foreign Application Priority Data

Nov. 3, 1980 [FR] France .............................. 80 23463

[51] Int. Cl.³ ............................................... G06F 7/38
[52] U.S. Cl. .................................... 364/716; 364/900; 340/825.83
[58] Field of Search ... 364/200 MS File, 900 MS File, 364/716; 307/465, 468, 469; 340/825, 825.22, 825.83

[56] References Cited

U.S. PATENT DOCUMENTS

| | | | |
|---|---|---|---|
| 3,987,286 | 10/1976 | Muehldorf | 364/716 |
| 4,034,356 | 7/1977 | Howley et al. | 364/716 X |
| 4,041,459 | 8/1977 | Horninger | 340/825.83 |
| 4,094,012 | 6/1978 | Perlegos et al. | 365/226 |
| 4,130,900 | 12/1978 | Watanabe | 365/189 X |
| 4,313,106 | 1/1982 | Hsu | 340/825.91 |

OTHER PUBLICATIONS

IEEE Journal of Solid-State Electronics, vol. SC-10, No. 5, Oct. 1975; Horninger: "A High-Speed ESFI SOS Programmable Logic Array with an MNOS Version", pp. 331-336.

Electronic Design, vol. 18, Sep. 1975; (Rochelle Park), Cavlan et Cline: "Field-PLAs Simplify Logic Designs", pp. 84-90.

*Primary Examiner*—James D. Thomas
*Assistant Examiner*—David L. Clark
*Attorney, Agent, or Firm*—Roland Plottel

[57] ABSTRACT

An electrically programmable logic network having an AND matrix, and OR matrix, and interfact circuits for inputting, outputting, and making connections between the matrices. To simplify programming of the matrices and to effect programming simultaneously for both matrices, there is provided a decoder designating an output column of the AND matrix and a corresponding input line of the OR matrix. The programming of the input lines of the AND matrix and of the output columns of the OR matrix is carried out by using the Ai variable inputs to the AND matrix and the Si outputs from the OR matrix as inputs, to the programming and with the same meaning as these Ai inputs and Si outputs have during the normal utilization of the network.

4 Claims, 10 Drawing Figures

INTEGRATED LOGIC NETWORK WITH SIMPLIFIED PROGRAMMING

BACKGROUND OF THE INVENTION

The present invention relates to programmable logic networks, i.e. integrated circuits having n logic signal inputs and m outputs, and adapted to supply at each of the outputs a particular programmed logic combination of the binary signals applied to the inputs. This logic combination is expressed in the form of a logic sum of several logic products of the input signals.

In the general case, a programmable logic network has two gate matrices, namely:

on the one hand a product matrix which consists of a series of p logic gates each having 2n inputs; these inputs are coupled to some of the n inputs Ai, complemented or not, of the network, and the outputs of the gates supply signals which are products of the input variables $a_i$ received; these products are designated by the term "intermediate products"; they are p in number if there are p gates; this product matrix is generally called AND and the gates are AND gates or perform the logic equivalent of an AND function;

on the other hand a sum matrix or OR matrix which consists of a series of m gates (as many as there are outputs of the network, i.e. as many as the different logic combinations to be effected); these gates are OR gates, or perform the logic equivalent thereof; they each have p inputs coupled respectively to some of the outputs of the p AND gates of the AND matrix; the outputs of the m OR gates supply logic sums of the signals applied to their inputs, i.e. sums of the products of the input variables. These outputs are the outputs of the network.

The purpose of programming the network is to arrange for each output to define a particular chosen combination of the input variables, expressed in the form of a sum of the products of certain of these variables.

We may digress here to point out that the reasoning would be identical if the positions of the OR and AND matrices were reversed to provide output logic combinations expressed in the form of products of sums. Boole algebra shows that such a reversal is possible without difficulty, and the invention will be merely described for sums of products.

The programming of the network consists then in defining the AND matrix so as to obtain products of some input variables, and to define the OR matrix in order to obtain sums of some of the products obtained.

For example, so as to obtain the combinations $$S_1 = \bar{a}_1 a_2 a_3 + a_1 \bar{a}_2$$

and $$S_2 = a_1 a_3 + a_1 \bar{a}_2$$

in a network with three inputs and two outputs, it is necessary:

(1) to provide an AND gate receiving $\bar{a}_1$, $a_2$ and $a_3$, another receiving $a_1$ and $\bar{a}_2$ and a third receiving $a_1$ and $a_3$;

(2) to provide an OR gate receiving the output of the first and second AND gates and another receiving the output of the second and third AND gates.

Before programming, the AND gates of the AND matrix may receive all the $a_i$ variable inputs and their complements; after programming they only receive the variables selected for forming a particular product; the others must be disconnected so that there is no influence, on a particular product, of an $a_i$ variable not appearing in this product.

Similarly, the OR gates of the OR matrix may receive, before programming, all the outputs of the AND gates, i.e. they may add up all the p intermediate products calculated by the AND matrix; after programming, an OR gate corresponding to an output of the network must only receive at its inputs the intermediate products appearing in the logic combination to be provided at this output; the outputs of the other AND gates, corresponding to products not appearing in the sum, must be disconnected.

The present invention relates to networks which are electrically programmable by the user and not those which are programmed during manufacture by masking techniques.

The problem to be resolved is the following: the electric programming of the network requires an individual electric access to all the inputs of the AND gates and of the OR gates, a total of $2n \times p$ AND gate inputs to which are added $p \times m$ OR gate inputs. For example, we may have 8 inputs breaking down into 16 with their complements, 8 outputs and 64 intermediate products (the numbers n, m and p are independent and determine the overall capacity of the network). These figures correspond to 1536 programming points to be provided. Each of these points must be individually accessible so as to apply an adequate programming signal (for example an electric voltage capable of destroying a fuse in series with a diode in a particularly simple construction).

The programming seen from the user's side consists in selecting the gate inputs which must receive a neutralizing signal, in applying this signal thereto and in leaving the other inputs active.

If there is a number of programming points as high as 1536, it may be arranged that 11 binary inputs ($2^{11} = 2048$) will serve to designate each of the gates through a decoder, so as to direct the programming signal exclusively to the designated gate. It is imperative, so as to minimize the number of external connection pins of the integrated circuit, for these inputs to be taken from the pins necessarily existing on the integrated circuit, for example the pins corresponding to the Ao and An-1 inputs and to the So to Sm-1 outputs, these pins not having in this case the same function in the normal logic computing mode and in the exceptional programming mode (a special input defining the mode).

For the operator, the problem is the following; he must:

establish the formulae of the different logic combinations to be achieved (the different product sums of the $a_i$ input variables); and must assign to each an output of the network, i.e. a given OR gate;

draw up a list of all the intermediate products appearing in the different logic combinations; and he must assign an AND gate to each of them;

determine, for a particular product i.e. for a respective AND gate, which inputs of this AND gate are to be neutralized, taking into account the correspondence between the $a_i$ inputs of the network and the AND gate inputs; this correspondence is direct since each $A_i$ input of the network is connected to a respective input of all the AND gates;

provide, before going over to programming, addressing of each of the inputs to be neutralized, taking into account the correspondence provided by the manufacturer, between the addressing inputs and the inputs of the AND gates to be neutralized; but this time, even if it is the $A_i$ inputs, i.e. the inputs of variables, which also serve as addressing inputs in the programming mode, the correspondence is no longer direct; it takes place through a binary code because of the large number ($2n \times p$) of programming points to be addressed in the AND matrix;

after having effected these operations and programmed the whole of the AND matrix, the operator must further determine, for a particular logic combination to be obtained, i.e. for a respective OR gate, which are the inputs of this OR gate which must be neutralized, taking into account the correspondence between the list of the intermediate products which he has drawn up and the OR gate input positions connected to the intermediate product outputs;

finally, the operator must provide, before going on with programming of the OR matrix, addressing for each of the OR gate inputs to be neutralized, taking into account the correspondence provided by the manufacturer, in the programming mode, between the addressing inputs and the OR gate inputs to be disconnected; this correspondence is furthermore obviously quite indirect and the user must know the binary coding thereof; if it is again the inputs of $a_i$ variables which serve as inputs for addressing the OR matrix in the programming mode, that makes an additional correspondence to be known by the programmer between the numbering of external pins of the network and the internal structure thereof.

An example of a programmable logic network using this principle is the circuit IM5200 from the firm INTERSIL, which is electrically programmable; in this circuit, two of the inputs of $A_i$ variables are used to define the changeover to the programming mode, four outputs of the network are used, in the programming mode, to designate AND and OR matrix sectors to be programmed, and nine inputs of variables are used, in the programming mode, to designate the gate inputs to be disconnected.

The very considerable work of the programmer may be justified since it is a non-reprogrammable network. However, it would be desirable, even in this case, to reduce this work; it is in any case necessary to achieve this if the network is electrically erasable and reprogrammable, otherwise the advantage of reprogramming would disappear in face of the difficulty thereof.

SUMMARY OF THE INVENTION

Such is the aim which the present invention seeks to attain by proposing a programmable logic network:

which presents great facility of use during programming, which allows in particular the AND matrix and the OR matrix to be programmed simultaneously contrary to what has been done up to now, to allow the direct use of the inputs of $A_i$ variables *with common significance in the reading mode and in the programming mode* of the AND matrix, which preferably does not require additional connecting pins for addressing the inputs of the gates of the AND matrix and of the OR matrix in the programming mode, which allows an after-programming test for individually checking either the programming of each AND or OR gate, or even that of each AND or OR gate input, with great facility of addressing the gates or inputs to be tested, which also allows, in the case of testing the programming of each gate, to test simultaneously the AND matrix and the OR matrix.

For that, according to one aspect of the invention there is provided an electrically programmable integrated logic array having n inputs for variables (Ai), m outputs (Si) for logic combinations of the variables, and a programmable product matrix having 2n inputs and p outputs for supplying p intermediate products of said variables. A programmable sum matrix having p inputs is connected through an interfact logic circuit respectively to said p outputs of said product matrix. The sum matrix has also m outputs connected through an output interface circuit to the m outputs of the array. A logic control circuit supplies to the array reading-mode-control signals (VA1, VA2) for providing a two step transmission of the variables from the n inputs for variables towards the 2n inputs of the product matrix. The array further includes a decoder for selecting through the interface logic circuit a given output of the product matrix and a respective input of the sum matrix; and an input interface circuit controlled by the logic control circuit and connected to the n inputs for variables and which supplies a signal to each of the 2n inputs of said product matrix.

In this array the input interface circuit has, for each input variable first and second latching circuits, and at least one by-pass gate.

The first latching circuit receives both a logical level from the input for variable and also a first one of the successive writing-mode-control-signals. It supplies, after reception of said first signal, a first programming signal of a first input of a pair of inputs of the product matrix.

The second latching circuit receives both a logical level from said input for variable and also a second one of the two successive writing-mode-control-signals. It supplies, after reception of said second signal, a second programming signal on a second input of said pair of inputs of said product matrix.

The by-pass gate, of which there is at least one, is controlled by the reading-mode-control-signals for transmitting directly, in a reading mode, a logical level present on the input for variable to one input of said pair of inputs of said product matrix, and a complementary logical level to the other input of that pair.

The interface logic circuit between the product and sum matrix receives writing control signals for supplying programming voltages, in a writing mode, to a selected output of the product matrix and to a respective input of the sum matrix.

Preferably the input interface circuit directs the first part of the writing signal applied to an Ai variable input towards an input line of the product matrix corresponding to this Ai variable, and it switches the second part to the input line corresponding to the Ai complement of this variable.

The test may be effected gate input by gate input to check the neutralization of each connection, or comprehensively gate by gate.

The test signals applied to the Ai variable inputs may be exactly the same as the particular writing signals: signals with two successive informations introduced in two stages, two successive 1s on Ai producing a line test signal on a matrix line corresponding to the $a_i$ variable, two successive 0s producing a line test signal on a line corresponding to $\bar{a}_i$, and a 1 and a 0 producing simultaneously a test signal on lines $a_i$ and $\bar{a}_i$. The input interface circuit operates then exactly in the same way during writing and during testing.

Mention has been made up to now of the role of the interface circuits during writing and during testing. In normal use of the network, i.e. in the reading mode, the input interface circuit transfers the logic signals appearing at the Ai inputs, on the one hand, directly to a line of the product matrix and, on the other hand, after inversion, to a neighboring line. The output interface circuit transfers directly the outputs of the columns of the sum matrix to the respective Si outputs. The matrix connection interface circuit connects the output of each product matrix column to a respective input line of the sum matrix.

In a preferred embodiment of the invention, field-effect transistors of the MNOS type (metal-nitride-oxide-semiconductor) are used for programming the connection of each variable input to a respective AND gate input, or the connection of each AND gate output to a respective OR gate input.

An MNOS transistor presents the possibility, outstanding for providing erasable electric programming, of being able to be permanently disabled by applying to its control grid a high voltage which forms an electron trap at the interface between the nitride layer and the oxide layer.

This property of MNOS transistors is used particularly economically (in numerous transistors used as gates) if the AND and OR gates are provided in the form of NOR gates. It is in fact equivalent from the logic point of view to use in the place of an AND gate with n inputs a NOR gate with n inputs with an inverter upstream of each input. Similarly, an OR gate is a NOR gate followed by an inverter. In the further description, reference will be made to OR and AND gates for designating their general function, knowing that they are formed from NOR gates.

BRIEF DESCRIPTION OF THE DRAWINGS

Other characteristics and advantages of the invention will appear from reading the detailed description which follows and which is made with reference to the accompanying drawings in which.

DESCRIPTION OF THE PREFERRED EMBODIMENT

Figure 1:
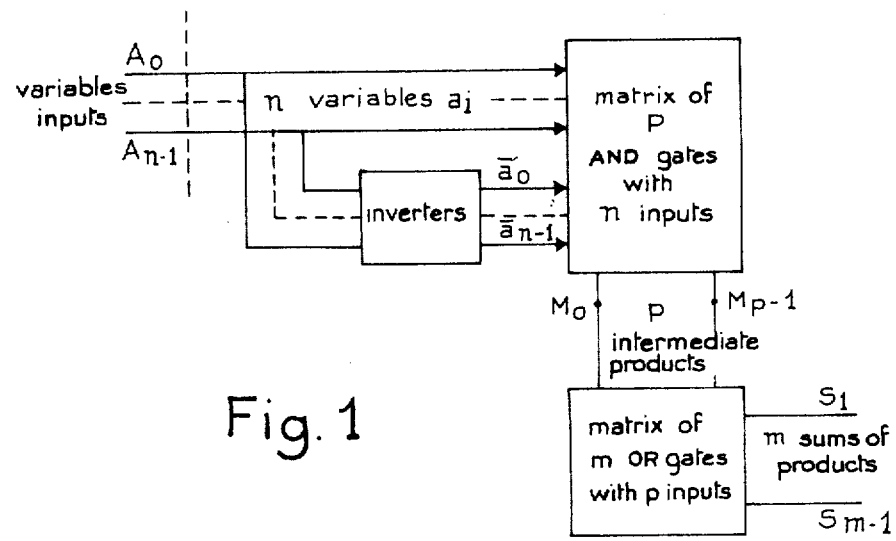
FIG. 1 shows the general extremely simplified diagram of a programmable logic network.

In FIG. 1 can be seen a simplified diagram of a programmable logic network: from n inputs of variables Ao to An−1 logic signals $a_o$ to $a_{n-1}$ and their complements $\bar{a}_o$ to $\bar{a}_{n-1}$ may be fed over 2 n input lines of an AND gate matrix (p AND gates with 2 n inputs each) which supplies at its output intermediate logic products Mo to Mp−1 of the input variables $a_i$ (direct or complemented). Each of the intermediate products is determined by those of the input variables or their complements which are effectively coupled to the AND inputs.

The intermediate products Mi form at the same time output columns of the AND matrix and input lines of an OR gate matrix (m OR gates with p inputs each) which supplies, at its output columns So to Sm−1, logic combinations of the input variables $a_o$ to $a_{n-1}$ in the form of intermediate product sums of the variables. Each of the sums is determined by the effective coupling between some intermediate product columns and the inputs of the OR gate corresponding to this sum.

Programming the network so as to obtain at each of the outputs the desired logic combination consists in selecting the connections to be formed between the variable inputs and the AND gates, as well as between the outputs of the AND matrix and the OR gate inputs.

Figure 2:
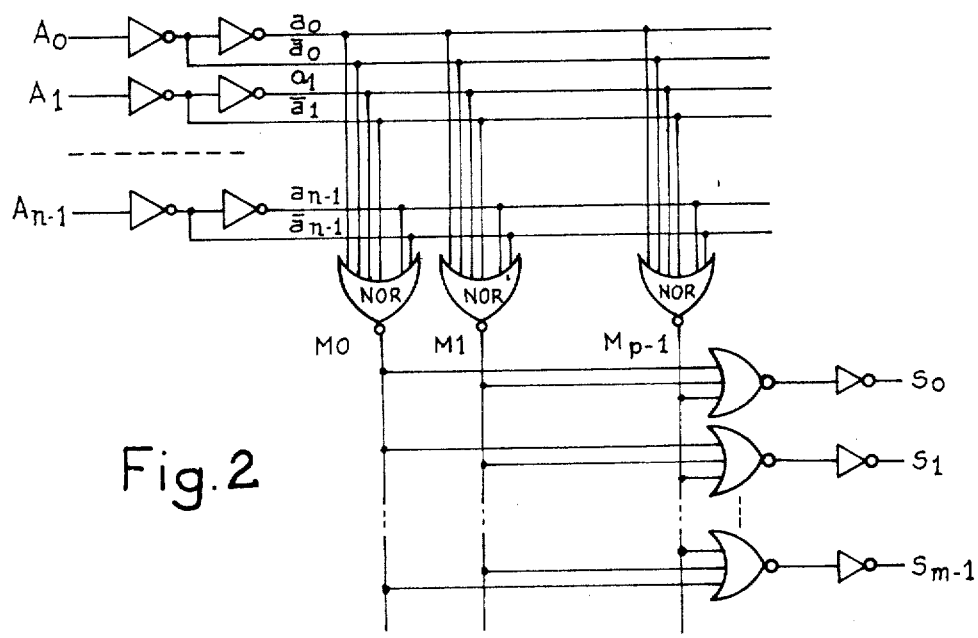
FIG. 2 shows the equivalent thereof formed with NOR gates.

FIG. 2 shows a logic network equivalent to that of FIG. 1 but where the product and sum matrices (AND and OR matrices) are formed with NOR gates. An AND gate may in fact be replaced by a NOR gate each input of which is preceded by an inverter; an OR gate by a NOR gate followed by an inverter. OR gates and inverters only could also be used.

Figure 3:
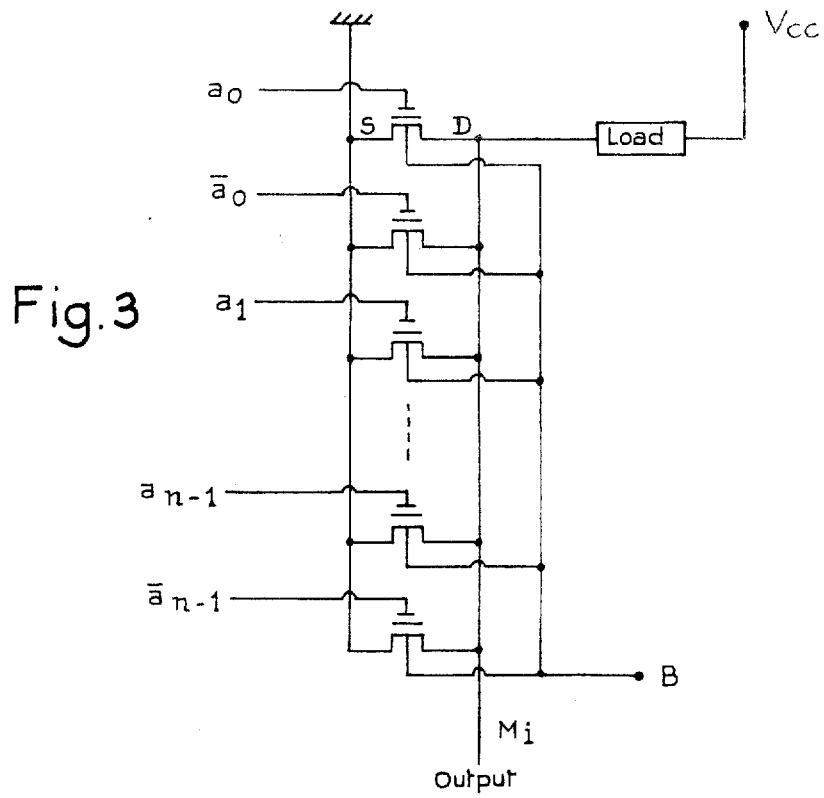
FIG. 3 shows a NOR gate constructed from MNOS transistors.

FIG. 3 shows an example of a NOR gate with n inputs $a_o, a_1 \ldots a_{n-1}$, formed from field-effect transistors which are here MNOS (metal-nitride-oxide-semiconductor) transistors with channel N. It could be another type of transistors without departing from the scope of the invention, but these are particularly appropriate for electric programming of the network.

To play the role of a NOR gate, the sources of the transistors are all joined together and connected to ground, the drains are all joined together and connected to a common load connected to a normal supply voltage Vcc. The substrates are all connected to a common voltage, in principle 0 volts.

Each transistor control grid serves as input for the NOR gate and the output is taken from the connected drains. The logic signals $a_o, \bar{a}_o, a_1, \bar{a}_1 \ldots \bar{a}_{n-1}$ serve for setting on or off the transistors. The setting on of one or more transistors by means of a high-level (1) logic signal (a few positive volts at the grid), resets the output to zero. Setting off all the transistors simultaneously sets the output to 1. It is therefore actually a NOR gate.

Programming the gate consists in suppressing or permanently disabling the transistors corresponding to the variables which must not affect the output; for example, to obtain at the output the product $a_i \bar{a}_j$ consists in suppressing or disabling all the transistors connected to the inputs other than $a_i$ and $\bar{a}_j$; similarly, to obtain the sum $a_i + \bar{a}_j$ would consist in only keeping as active transistors those connected to the $a_i$ and $\bar{a}_j$ inputs.

It will be readily understood that it is within the scope of the invention to adopt another NOR or OR gate structure, for example using the source of the transistors as output with a load in series with the source and the drain at a fixed voltage.

The choice of MNOS transistors as elements for the gates is particularly advantageous for it offers a convenient possibility of electric programming in which the influence of a NOR gate input on the output thereof is neutralized.

This neutralization is effected by placing in a permanently disabled state the MNOS transistor by trapping electrons at the interface of its two dielectric layers, the trapped electrons maintain the threshold voltage of the transistor at a high value (about 7 V) and create an enabling voltage threshold which a normal logic signal (0 to 5 V) applied to the grid cannot exceed. The "untrapped" transistors are enabled or disabled depending on their grid voltage for their threshold voltage is low: 1 to 2 volts.

Trapping takes place by applying a high voltage (about 25 volts) to the grid. It is nondestructive and reversible: the trapped electrons may be drained off to the substrate by applying a high voltage thereto, thus realizing an electric erasing of the programming, all the transistors coming back to their normal state.

There may already be mentioned, before describing the block diagram of the network of the invention, the table of the voltage values to be applied to the different electric connections of the MNOS transistor NOR gate for using the network in its normal function (reading mode), erasing (erase mode), programming new functions of the network (writing mode).

(1) Reading

Sources at 0 volt
Drains connected to the load
Load connected to Vcc=about 5 volts
Substrate at zero
Grids receiving the logic signals from the variable inputs for the AND matrix and the gate outputs of the AND matrix for the OR matrix
Output from connected drains.

(2) Erasing

Sources disconnected (high impedance condition)
Drains disconnected (high impedance condition)
Grids connected to ground
Substrates connected to a high voltage Vpp~25 volts (3) Writing (a) Transistors to be disabled
Sources disconnected
Drains to 0 volt
Substrate at 0 volt
Grids at high voltage
(b) Transistors to be kept active
Sources disconnected
Drains at 0 volt
Substrate at 0 volt
Grids at 0 volt
(c) Columns of transistors to be protected while a particular column is programmed
Sources disconnected
Drains at high protection voltage Vp
Substrate at 0 volt
Any grid voltages.

It will be noted that these voltage application modes for writing allow each NOR gate matrix to be programmed column by column since the application of a protection voltage Vp to the drains protects the corresponding columns without preventing the application of any grid voltages whatsoever to all the transistors of the matrix.

Each matrix will be formed in the following way:

all the sources of the MNOS transistors are connected together in columns so that a source column may be grounded or unconnected;

all the drains are connected together in columns so that each column of drains may be, independently of the others, connected to a load or to ground or to a protection voltage Vp, or unconnected;

all the grids are connected together in lines of the matrix so that each line may be, independently of the others, connected to a zero or normal voltage (for reading and testing), or to a zero or high voltage (for writing);

all the substrates are connected together and to a control conductor which may place them at a zero (general case) or high (for erasing) voltage.

The role of the interface circuits of the network will be to apply the appropriate voltages to the grid lines, the source and drain columns and the connected substrates, depending on the operating mode signals (reading, erasing, writing, testing) and on the logic signals applied to the different inputs of the network, including the outputs used as inputs.

The basic structural principle of the electrically programmable logic network of the invention having thus been explained, the block diagram of the network will now be described for essentially achieving programming in the simple form explained in the preamble to the present patent application.

Figure 4:
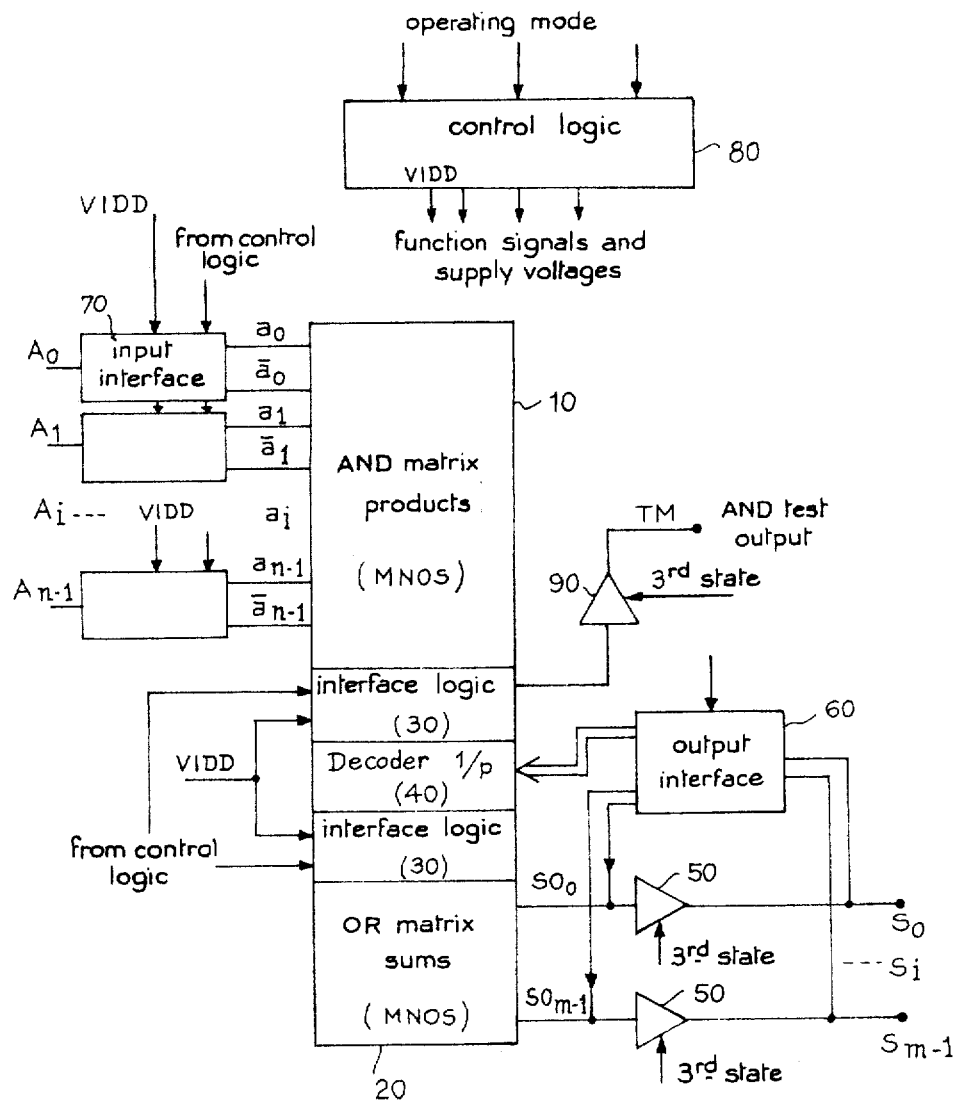
FIG. 4 shows a block diagram of the network structure according to the essential feature of the invention.

This block diagram is shown in FIG. 4. There can still be seen in this figure an AND product matrix (10) with its 2n inputs for variables $a_o$, $\bar{a}_o$ to $a_{n-1}$, $\bar{a}_{n-1}$, and an OR matrix (20) based on MNOS transistors. The connection therebetween is not direct, it takes place through an interface logic circuit (30) which has as its essential roles:

on the one hand re-establishing direct contact between the AND matrix and the OR matrix for the reading mode, on the other hand establishing, for the erase mode, for the writing mode (and also for the testing mode when it is desired to verify the programming of the network), the appropriate connections for applying the desired voltage levels to the drain and source columns of the transistors of the AND matrix, to the grid lines of the OR matrix and to the substrates of the transistors of the two matrices.

In accordance with the essential feature of the invention, a decoder (40) is provided, adapted to designate individually each of the output columns and of the AND matrix as well as the input line of the OR matrix corresponding to the same intermediate product as the output column designated.

This designation is intended for the interface logic circuit which ensures application of the suitable voltages to this designated column and line.

The decoder is formed for example simply by a series of p AND or NOR gates which receive binary addresses serving for designating the chosen column and which have (definitively) programmed inputs so that each possible address opens one and only one gate among the p gates of the decoder.

The decoder serves for the writing mode more especially but also for the testing mode.

The binary addresses which it receives are fed through external connection pins by means of which the user chooses the transistor column to be programmed in the AND matrix. These pins are, in a desire to reduce the number of external pins, preferably chosen among pins used for other purposes in the reading mode. They are however not taken from among the input pins for variables Ao to An−1 which serve for another use during programming.

In the preferred example described, the addressing inputs of the decoder in the writing mode are taken from among the outputs So to Sm−1 of the network, which then function as inputs. In reality, a number r of addressing inputs of the decoder is needed such that $2^{r-1}<p\leq 2^r$; for example, if the network comprises 64 intermediate products, 6 addressing inputs may be used chosen from among the So to Sm−1 outputs. It is these r inputs, split into 2×r with their logic complements which are applied to the p gates forming the decoder.

So that the So to Sm−1 outputs may function as outputs of the OR gates of the OR matrix, and also as inputs for the decoder, there are placed between the OR gate outputs and the terminals Si buffer amplifiers (50) having three states, with a third state control isolating the Si outputs from the SOi outputs of the OR matrix. The third state is set during the writing mode and is discontinued during the reading mode. In the testing mode, it will be seen that it is used partially.

The Si output terminals (So to Sm−1) are therefore connected to the inputs of the decoder, but through an output interface circuit (60) having more especially a locking and switching role because it is desired, during the writing mode, to use the Si outputs not only as inputs for addressing the decoder (in a first stage of writing), but also in a second stage as writing inputs properly speaking through which those of the MNOS transistors of the OR matrix may be designated which must be disabled (the decoder only indicating which input line of the OR matrix is concerned during a programming step).

The output interface circuit (60) is there to store the addressing of the decoder while there is fed into the Si terminals the writing data which are directed towards the SOi outputs of the OR gates (connected drains of the MNOS transistors).

Just as the programming instructions for the OR matrix were fed in two stages into the Si outputs, addresses of the decoder then writing data, the writing data for the AND matrix is also fed in in two stages. This has already been explained in the preamble to the patent application: whilst the addressing of the decoder is placed and stored in memory, thus designating the transistor column forming an AND gate which is concerned, there is fed into the Ai inputs (Ao to An−1) of the network information for designating those of the transistors of the column which must be "trapped" (permanently disabled). Since, for each Ai input, there are three types of possible cases depending on the intermediate product to be obtained (presence of $a_i$ in the product, presence of $\bar{a}_i$, absence of $a_i$ and of $\bar{a}_i$), a single piece of binary information is insufficient; so two successive pieces of information are fed simultaneously into all the Ai inputs, i.e. two successive writing vectors; they are fed respectively in the first and the second writing stages defined for the writing of the OR matrix by the Si outputs.

The writing vectors are fed into and stored in memory in interface circuits (70) which effect, during the writing mode and furthermore also during the testing mode, decoding of the two information bits fed into each Ai variable input for designating that one of the MNOS grid lines corresponding to Ai which is to be programmed or tested.

For the operator, the programming work is simple and the programming of the AND and OR matrices is simultaneous. It takes place step by step, each step corresponding to an intermediate product to be obtained so to a transistor drain column in parallel for the AND matrix and to a grid line in parallel for the OR matrix.

The operator chooses from the logic combinations to be obtained an intermediate product. He assigns thereto a particular column of the AND matrix; he determines the address of this column to be fed into the Si inputs in the first stage of the writing step; he examines in what output logic combinations this intermediate product must appear (programming of the OR matrix); he determines the OR matrix writing vector to be fed for that into the Si outputs in the second stage of the step; this vector is written in an extremely simple manner: a logic 1 is fed into Si if the output logic combination at Si must comprise the intermediate product, if not a zero is fed in. At the same time, the programmer examines which are the variables or the complements contained in the intermediate product (programming of the AND matrix); the correspondence between these variables and the vectors to be applied to the Ai inputs is again very direct:

if the $a_i$ variable appears in the intermediate product, a logic 1 is written in during the first stage of writing then again a logic 1 in the second stage;

if it is the complement $\bar{a}_i$ which appears, first of all a 0 is written in then again a 0;

if the $a_i$ variable does not appear at all, a 1 is written in first of all then a 0.

By doing that for all the $a_i$ variables, two successive writing vectors are obtained which can be resumed thus:

|  | Vector 1 element | Vector 2 element |
| --- | --- | --- |
| Occurrence of $a_i$ | 1 | 1 |
| Occurrence of $\bar{a}_i$ | 0 | 0 |
| Nonoccurrence of $a_i$ and $\bar{a}_i$ | 1 | 0 |

This code is very simple mnemotechnically for the operator. Another one, slightly different, could also be used without departing from the scope of the invention.

To finish the description of FIG. 4, the presence of a control logic circuit (80) will be mentioned which receives information or operating voltage levels from the outside for defining the work mode and the times for triggering writing cycles as well as the synchronization of the writing in of data during programming and testing modes. This logic circuit, shown better symbolically in FIG. 5, establishes functional control signals transmitted to the different interface logic circuits (30, 60, 70), to the three state controls of the buffer amplifiers, etc.

This control logic circuit (80) has more especially functions for converting logic levels when that is required, including forming a compatibility interface between circuits of different technologies.

In FIG. 4 there will be seen an output TM downstream of a threestate amplifier (90). This is a test output for examining, in the testing mode, the output of each of the transistor columns of the AND matrix, so as to determine if the application of a given logic vector to the Ai inputs causes at each AND gate output (chosen by the decoder) the expected logic result.

To specify more precisely the test operations, which are accomplished in a similar way to those for writing, and for both matrices at one and the same time, it may be said that the operator feeds test signals into the Ai inputs, either to one input at a time, or by means of vectors. These vectors are fed in in two stages and they designate the input lines of the AND matrix which are examined. Meanwhile, a given intermediate product address (so a column of the AND matrix and an input line of the OR matrix) is fed into the Si outputs (first stage of the test step). Then with this address stored in memory, the Si outputs again serve as outputs and not as inputs and supply the results of the test: a 1 at Si means that the designated intermediate product will appear at the Si output during reading; a 0 indicates that it will not appear. The meaning of the result of testing the OR matrix is then immediate. For the AND matrix, the meaning is just as simple: a particular test signal (1, 1 or 0, 0) applied to an Ai input causes a 1 or a 0 to appear at the test output TM according as to whether the $a_i$ variable appears, complemented or not in the designated intermediate product.

Figure 5:
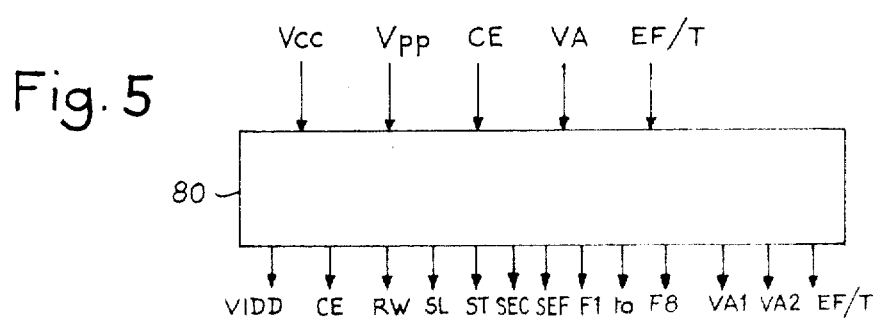
FIG. 5 shows the block diagram of the logic control circuit of the network.

FIG. 5 shows symbolically the control logic circuit which receives a normal supply voltage for complementary MOS circuits, Vcc=about 5 volts;

a supply voltage Vpp which, if it is 5 volts defines the reading or test mode and if it is 25 volts defines the writing or erase mode;

a signal CE for initiating operation of the circuit serving principally for triggering each operating step (for example each writing step of an intermediate product);

a signal VA for causing writing or test data to be fed into Ai and Si; coupled with CE, it divides the writing steps into two stages; it acts on the input and output interface circuits;

a signal EF/T which defines the beginning of an erase or test cycle according to the Vpp level.

From this input information, the control circuit (80) establishes different control signals applied to the interface circuits to cause the erase, writing, testing or reading conditions to be applied to the transistors of the two matrices.

The output signals of the control circuit (80) are:

the signals CE and EF/T themselves, possibly made compatible, if they were not already so, with the rest of the circuit;

a supply voltage VIDD which, apart from the writing time properly speaking, is equal to Vcc and which becomes Vpp at the time of writing; this voltage VIDD supplies come circuits which are not supplied directly by Vcc or Vpp;

a signal VA1 and a signal VA2 which follows it, these signals defining from VA and CE the two stages for feeding programming data into the Ai inputs and the Si outputs during the writing or testing mode;

a signal RW which detects if Vpp is a low (0 to 5 volts) or high (25 volts) voltage for preventing any passage during the writing or testing mode if the voltage is high (risk of destroying the programmed condition of the transistors), and only to allow passage under erase or writing conditions;

four signals SL, ST, SEC, SEF defining from EF/T and RW respectively the reading, testing, writing, erase modes;

eight signals F1 to F8 defining separate conditions useful for controlling the different circuits; they are respectively:

F1: function indicating that neither writing nor testing is in process

F2: the erase mode is not in process nor is it the writing time properly speaking (defined by SEC and CE)

F3: the erase mode is in process or reading is in progress

F4: writing properly speaking is in progress

F5: the erase mode is in process or testing in progress

F6: testing is in progress

F7: erase is not in progress

F8: level initiated with RW or $\overline{CE}$.

The provision of the different functions of the control circuit (80) is a simple matter of combinative logic and use of buffer amplifiers when it is a question of carrying out voltage logic level conversions. It is not necessary to give the details of the diagrams of logic gates providing each control function.

In FIGS. 6 to 10 can be seen the complete diagrams of a preferred embodiment of the other different circuits of the programmable network, and particularly the interface circuits (30, 60 and 70). These diagrams can be easily understood by a man skilled in the art, taking into account the following explanations and a fully detailed explanation thereof will not be given.

Figure 6:
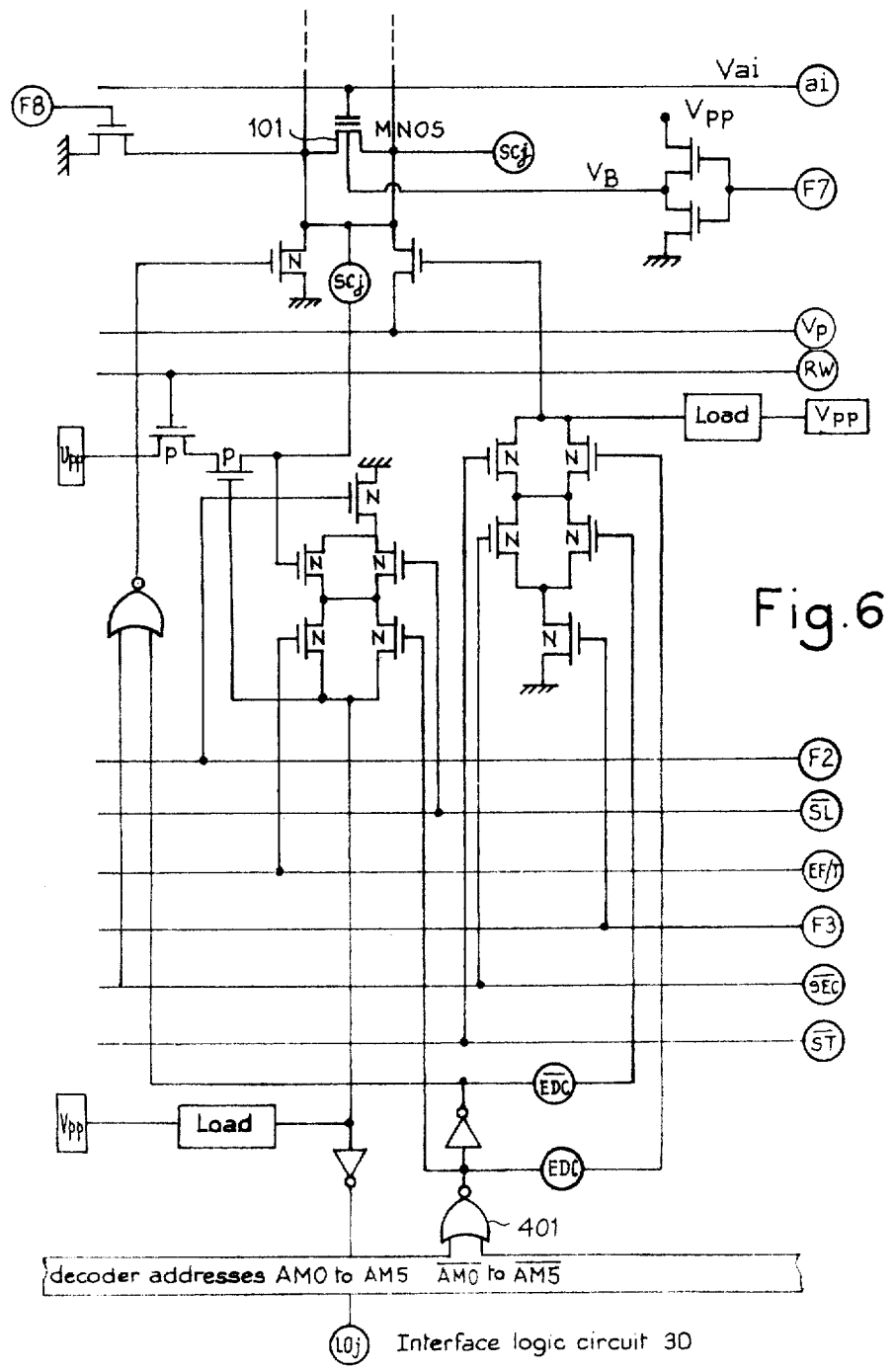
FIG. 6 shows the interface circuit for connection between matrices.

First of all, FIG. 6 shows the interface logic circuit (30) for connecting the matrices together with the decoder (40), this at the level of a single MNOS transistor column j of the AND matrix; only a single MNOS transistor 101 of the AND matrix has been shown, the one whose grid is to receive a high trapping voltage if the $a_i$ variable is to appear in the intermediate product corresponding to the column j considered.

This transistor 101 receives at its grid a voltage Vai which may be zero or 5 volts or 25 volts. (See FIG. 7 for the production of this voltage by the input interface circuit 70).

The source may be grounded or left in the air depending on the state of function F8.

The drain corresponds to the AND (in fact NOR) column output SCj and it may be connected to a load supplied by Vpp (during reading), or left in the air (erase) or placed at protection voltage Vp (writing when the column is not selected), or finally placed at zero (writing when column j is selected).

It will be remembered that the column selection is provided by a decoder whose NOR gate corresponding to column J is shown under the reference 401.

Finally, the substrate of the MNOS transistor may be set at 0 volt or at Vpp depending on the state of function F7.

The different gates of the interface logic of FIG. 6 have been shown in detail so as to illustrate how they establish the different voltage or impedance levels at the terminals of the MNOS transistor of line i and of column j from the output condition of gate j of the decoder and of the different outputs of the control logic circuit.

The interface logic circuit (30) also imposes a given output voltage on the conductor LOj which is the input line j of the OR matrix (input to an MNOS transistor grid). During reading, the signal on LOj is the same as SCj; it is moreover the only case where there is direct transmission between the AND matrix and the OR matrix.

Apart from reading the erase mode may be operative and a zero voltage appears on LOj; or the writing mode and the voltage appearing on LOj is high if the decoder has selected the column or low if the decoder has not selected it; or the testing mode and LOj=Vcc or 0 volt depending on whether the decoder has selected the column or not.

The line Vp serves both for supplying a protection voltage during writing or erase (see FIG. 10) and also for collecting the state of SCj (isolated from LOj at that time) in the testing mode.

Figure 7:
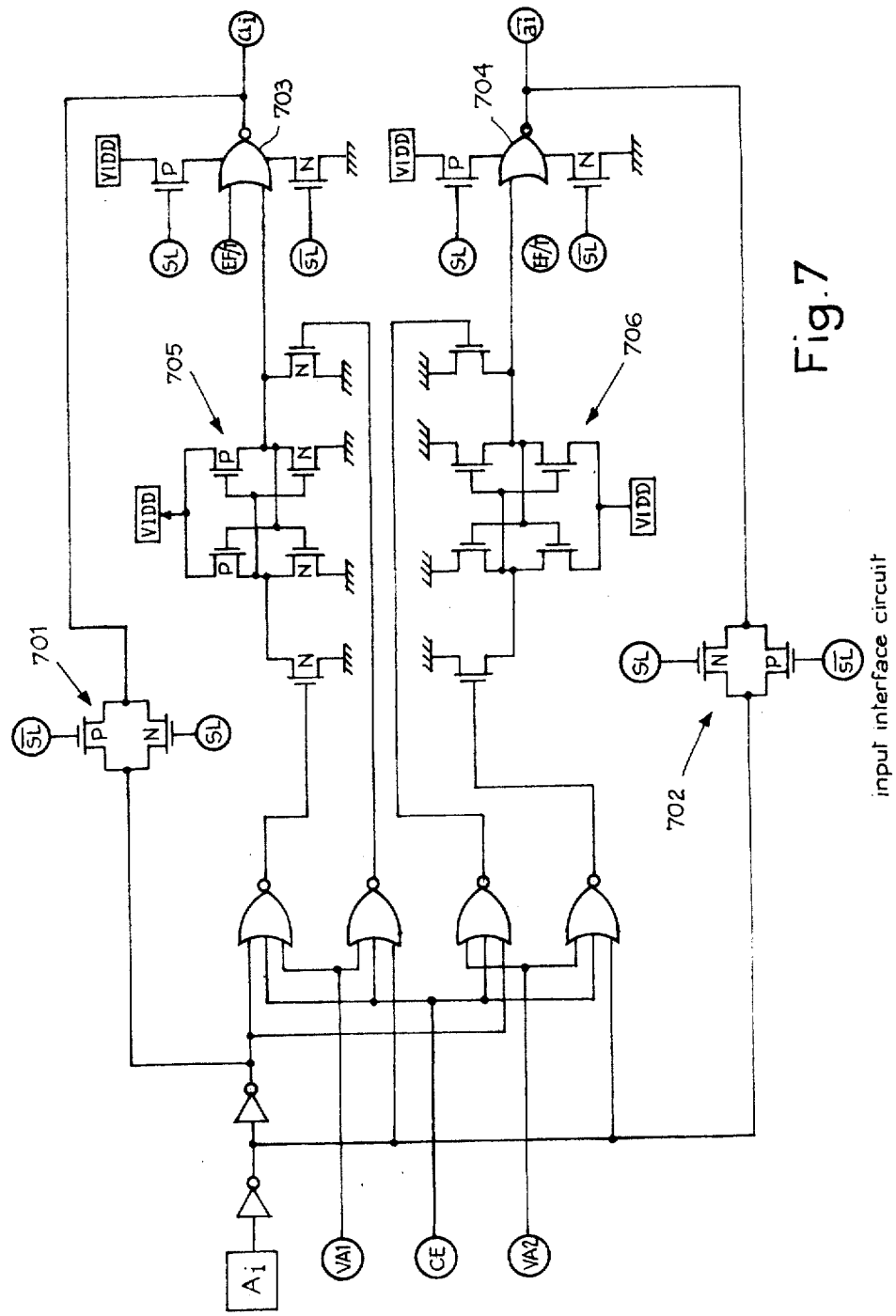
FIG. 7 shows the input interface circuit.

FIG. 7 (diagram of an input interface circuit 70) shows how the appropriate voltage is produced on the input lines $a_i$, $\bar{a}_i$ leading to the grids of the MNOS transistors of the AND matrix; the diagram is one example using the signal SL (reading mode) for connecting through transfer gate 701 and 702 the Ai input to the line $a_i$ and, with an inverter, to the line $\bar{a}_i$. Apart from the reading mode, the signal EF/T is applied to two gates 703 and 704 capable of transferring the voltage VIDD to lines $a_i$ and $\bar{a}_i$.

During erase, a zero voltage is applied to the grid lines $a_i$ and $\bar{a}_i$; during testing and writing, the voltage applied depends on the logic signal applied to the Ai input.

In both cases, testing or writing, the feeding in of data takes place in two stages and the input interface circuit receives first of all a first information bit during the duration of signal VA1 (itself contained in the duration CE); this bit is transferred by the buffer locking amplifier 705 and gate 703 to the line $a_i$; if testing is in progress, this bit is transferred in the form of a 5-volt voltage (VIDD=Vcc) or zero; if writing is in progress, it is a voltage of 25 volts (VIDD=Vpp=25 volts) or zero.

When the signal VA1 stops, the buffer locking amplifier 705 does not change condition and the voltage at $a_i$ remains unchanged.

The signal VA2 then begins, at the same time as there is loaded at the Ai input a second testing or writing information bit, which is transferred in complemented form, by another buffer locking amplifier 706 which also plays the role of inverter and by gate 704, to line $\bar{a}_i$. During testing a 1 on Ai results in 0 volts on $\bar{a}_i$ whereas a zero results in 5 volts. During writing, a 1 on Ai results in 0 volts on $\bar{a}_i$ whereas a zero results in 25 volts.

It will then be readily understood that with the very simple writing or testing coding, in two bits loaded successively and locked, there may be applied independently on $a_i$ and $\bar{a}_i$, through a single Ai input, the conditions for the trapping or nontrapping of one or other or both MNOS transistors coupled to $a_i$ and $\bar{a}_i$. In fact, the successive feeding of bits 1,1 on Ai results in a voltage on $a_i$ and not on $\bar{a}_i$ at the end of VA1 and VA2; the feeding of 0,0 results in a voltage on $\bar{a}_i$ and not on $a_i$; the feeding of 1,0 results in a voltage both on $a_i$ and on $\bar{a}_i$ and both corresponding transistors are trapped.

Figure 8:
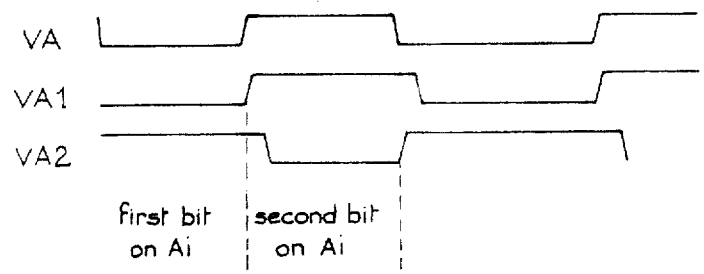
FIG. 8 shows the timing diagram of the signals determining the two-stage programming or testing.

There has been shown in FIG. 8 how the VA1 and VA2 signals are located with respect to the loading signal VA which generates them, the feeding of the first information bit into the Ai inputs taking place while VA1=0 and the feeding of the second while VA2=0.

Figure 9:
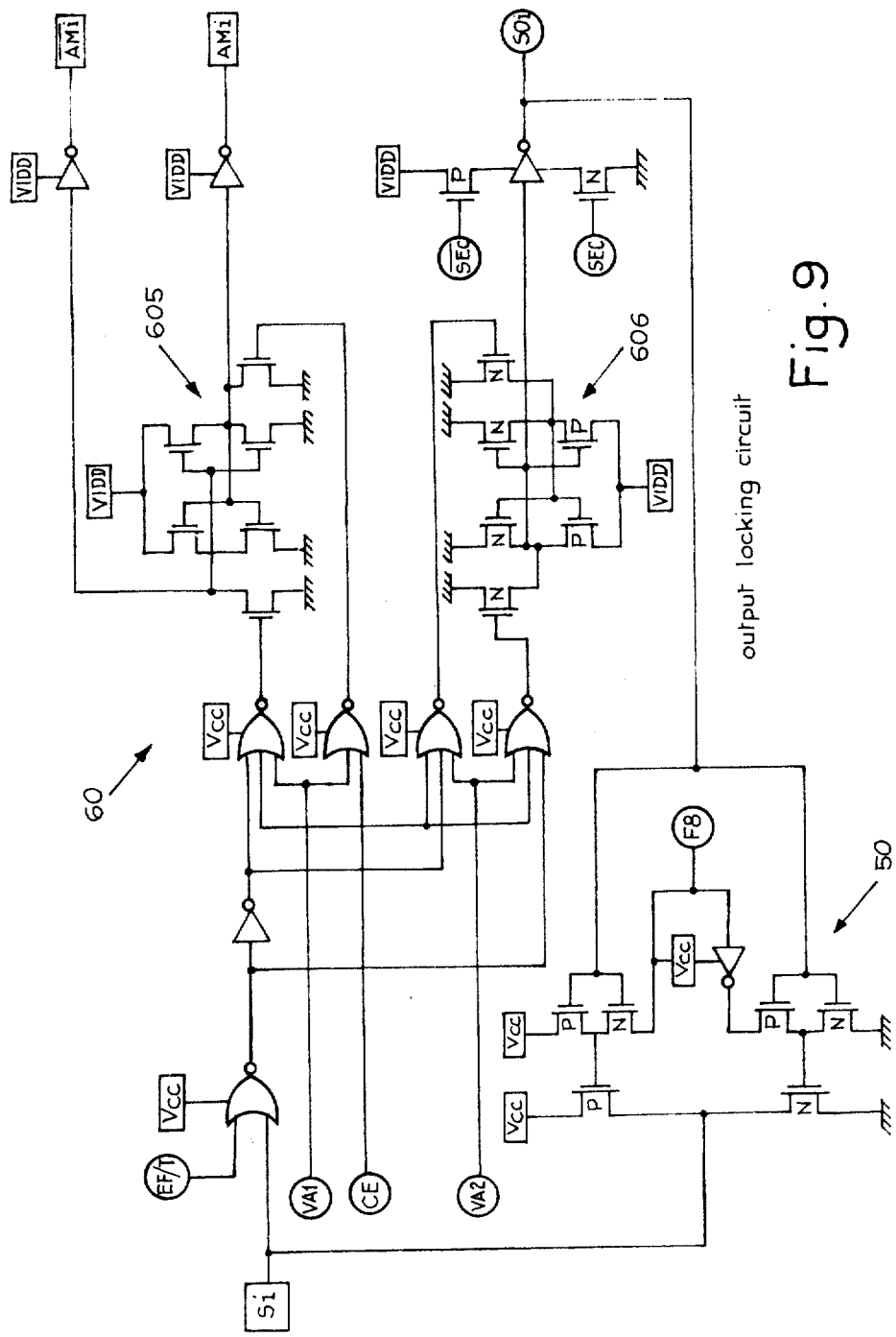
FIG. 9 shows the output interface circuit.

FIG. 9 shows an embodiment of an output interface circuit (60) for receiving a decoder address or writing data for the OR matrix from the Si outputs of the network; the diagram of the three-state amplifier (50) for using the Si outputs not only as outputs connected to the SOi outputs of the OR matrix but as addressing or data input inputs is also shown in the drawing of FIG. 9.

Circuit 60 is quite similar to that of FIG. 7, controlled by VA1 and VA2 with two buffer amplifiers 605 and 606 directing the input bits on Si respectively to the decoder address lines (AMi and $\overline{AMi}$) while VA1=0, and towards the SOi output columns of the OR matrix while VA2=0. After the two stages of writing, there is then an addressing signal stored on AMi and $\overline{AMi}$, designating a given intermediate product which is applied (see FIG. 6) to the input lines of the OR matrix (LOj), and a writing voltage VIDD or zero on the SOi columns.

This writing voltage goes to the drains of the transistors. Consequently it is equal to 0 if the transistor is to be trapped (absence of the intermediate product designated by the decoder in the logic combination to be produced on Si), or else it is equal to VIDD=25 volts (or a slightly lower protection voltage Vp) if the intermediate product is to appear and if consequently the corresponding transistor is not to be trapped.

In the second stage VA2 of writing Si=1, so SOi=0 volts, if the intermediate product is to appear; if not, Si=0 so SOi=25 volts.

This writing-in is enabled by the signal SEC (writing mode) which allows application of VIDD or 0 to SOi.

The SOi output is furthermore connected, for reading or testing, to Si through the three-state amplifier 50, controlled by the signal F8, which prevents the direct return, during writing or in the first stage of the test, of the signal from Si to the SOi columns.

Figure 10:
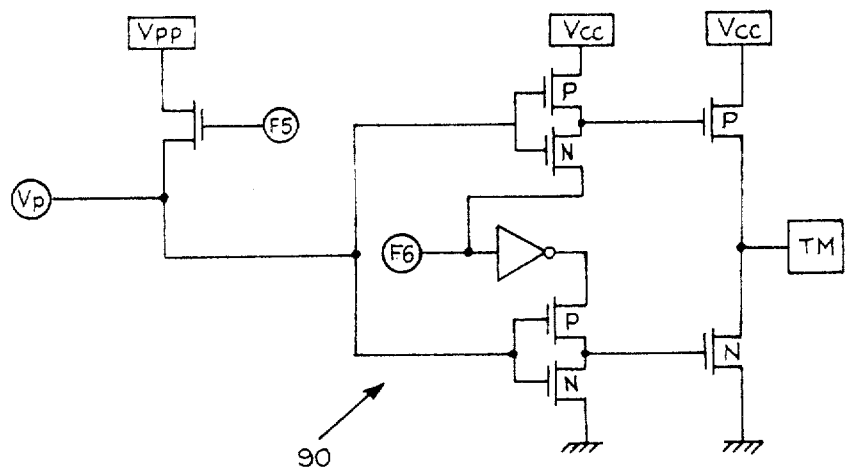
FIG. 10 shows a circuit for producing a test result of the AND matrix and for producing a voltage protecting the drains of the MNOS transistors.

FIG. 10 shows the three-state amplifier 90 of FIG. 4. It has two functions:

(1) to transfer during the test mode the state of the column output SCj (AND matrix) designated by the decoder (see FIG. 6); this transfer takes place over line VP and amplifier 90 feeds it to an external test terminal TM under the control of the control function F6 indicating that the test mode is in process;

(2) to supply a protection voltage Vp which may be equal to Vpp to the drains of the columns SCj of the AND matrix not selected by the decoder, in the writing mode.

To complete this description, it may further be mentioned that the two-vector information fed into the Ai inputs during the programming mode, of which it was said that it allowed three programming states to be defined, in reality allows a fourth state to be introduced (two bits=four possible states). This fourth state, which would be determined by the feeding of a 0 then a 1 on Ai would indicate the presence both of $a_i$ and $\bar{a}_i$ in an intermediate product, which would cancel out this latter. This state may serve for neutralizing nondesired intermediate products.

Finally, the above description has been made in connection with MNOS transistors. Other programmable and electrically erasable transistors may be used (floating-grid transistors for example).

What is claimed is:

1. An electrically programmable integrated logic array comprising n inputs for variables (Ai), m outputs (Si) for logic combinations of the variables, a programmable product matrix having $2n \times p$ programmable elements arranged in 2n lines and p columns and having n pairs of inputs and p outputs for supplying p intermediate products of said variables, and a programmable sum matrix having m×p programmable elements arranged in p lines and m columns and having p inputs connected through an interface logic circuit respectively to said p outputs of said product matrix, said sum matrix having also m outputs connected through an output interface circuit to said m outputs of the array, a logic control circuit for supplying to the array reading mode control signals and writing mode control signals among which two successive writing mode control signals (VA1, VA2) providing a two step transmission of said variables from each of the n inputs for variables to a respective pair of inputs of said product matrix, said array further including a decoder connected to said interface logic circuit for selecting a given output of said product matrix and a respective input of said sum matrix, and an input interface circuit controlled by said logic control circuit and connected to said n inputs for variables and supplying signals to each of the 2n inputs of said product matrix, wherein said input interface circuit comprises, for each input for variable,

- a first latching circuit receiving a logical level from said input for variable and a first one of the two successive writing mode control signals, and supplying, after reception of said first signal, a first programming signal on a first input of a pair of inputs of said product matrix, for programming the elements of a line of the product matrix corresponding to this first input,
- a second latching circuit receiving a logical level from said input for variable and a second one of the two successive writing mode control signals, and supplying, after reception of said second signal, a second programming signal on a second input of said pair of inputs of said product matrix, for programming the elements of a line of the product matrix corresponding to the second input,
- at least one by-pass gate controlled by said reading mode control signals for transmitting directly, in a reading mode, a logical level present on said input for variable to one input of said pair of inputs of said product matrix and a complementary logical level to the other input of said pair, and wherein said interface logic circuit between the product and sum matrix receives writing control signals for supplying programming signals, in a writing mode, to a selected output of said product matrix and to a respective input of said sum matrix, for programming the elements of a column of the product matrix and of a corresponding line of the sum matrix.

2. An electrically programmable integrated logic array according to claim 1 wherein one of the latching circuits corresponding to a predetermined input variable is designed for transmitting the logical level present on said variable input, while the other latching circuit corresponding to the same input variable is designed for transmitting the complement of said logical level present on said variable input.

3. An electrically programmable logic array according to claim 2 wherein said two successive writing mode control signals are provided by the control logic circuit also in a test mode, and wherein a test circuitry is provided for supplying to a test pin, at the end of the second of said two successive writing mode control signals, a signal indicating the logical level at the selected output of the product matrix.

4. An electrically programmable logic array according to claim 1 wherein said matrices comprise arrays of MNOS transistors each having a source, drain, gate and substrate, said transistors being arranged in lines and columns, each input of each matrix being formed by the connected gates of a respective line of transistors, each output of each matrix being formed by the connected drains of a respective column of transistors, and wherein the interface circuits are arranged to establish, under control of signals issued from the control logic circuit, the following voltage and load configurations:
  (a) in a reading mode sources of transistors are at zero volt, drains are connected, through a load, to a normal reading voltage, substrates are at zero volt, gates are at a normal reading voltage or at zero volt,
  (b) in an erasing mode, sources are disconnected, drains are disconnected, gates are at zero volt, substrates are at a high level voltage,
  (c) in a writing mode, for transistors of a column being written, sources are disconnected, drains at zero volt, substrate at zero volt, gates are at a high level voltage or zero volt,
  (d) in a writing mode, for transistors of a column not being written, sources are disconnected, drains are protected by a high protecting voltage, substrates at zero volt and gates at zero or high voltage.

* * * * *